(12) United States Patent
Fujikawa et al.

(10) Patent No.: US 8,557,711 B2
(45) Date of Patent: Oct. 15, 2013

(54) ETCHING SOLUTION COMPOSITION FOR METAL FILMS

(75) Inventors: Kazuhiro Fujikawa, Tokyo (JP); Tsuguhiro Tago, Niigata (JP)

(73) Assignees: Kanto Kagaku Kabushiki Kaisha, Tokyo (JP); Sanyo Electric Co., Ltd., Osaka (JP); Sanyo Semiconductor Manufacturing Co., Ltd., Niigata (JP)

( * ) Notice: Subject to any disclaimer, the term of this patent is extended or adjusted under 35 U.S.C. 154(b) by 784 days.

(21) Appl. No.: 12/352,020

(22) Filed: Jan. 12, 2009

(65) Prior Publication Data

US 2009/0124091 A1 May 14, 2009

Related U.S. Application Data

(62) Division of application No. 11/001,737, filed on Dec. 2, 2004, now abandoned.

(30) Foreign Application Priority Data

Dec. 3, 2003 (JP) ................................ 2003-404439

(51) Int. Cl.
*H01L 21/306* (2006.01)
*B44C 1/22* (2006.01)

(52) U.S. Cl.
USPC ............... 438/754; 216/13; 257/E21.219

(58) Field of Classification Search
USPC ............... 438/754; 216/13; 257/E21.219
See application file for complete search history.

(56) References Cited

U.S. PATENT DOCUMENTS

| | | | |
|---|---|---|---|
| 4,895,617 | A | 1/1990 | Roche et al. |
| 6,136,514 | A | 10/2000 | Phan et al. |
| 6,525,009 | B2 | 2/2003 | Sachdev et al. |
| 2002/0072482 | A1 | 6/2002 | Sachdev |
| 2003/0060056 | A1 | 3/2003 | Park et al. |
| 2003/0079416 | A1* | 5/2003 | Ma et al. ..................... 51/307 |
| 2004/0046148 | A1* | 3/2004 | Zhang et al. ............. 252/79.4 |
| 2005/0136672 | A1 | 6/2005 | Fujikawa et al. |

FOREIGN PATENT DOCUMENTS

| | | |
|---|---|---|
| EP | 0 416 126 B1 | 3/1991 |
| EP | 1 333 477 A2 | 8/2003 |
| JP | 57-164199 | 10/1982 |
| JP | 61056284 A | 3/1986 |
| JP | 01-301869 A | 12/1989 |
| JP | 4-506528 A | 11/1992 |
| JP | 05-132700 | 5/1993 |
| JP | 06-41770 | 2/1994 |
| JP | 06-122982 A | 5/1994 |
| JP | 07-060096 | 3/1995 |
| JP | 07-176525 A | 7/1995 |
| JP | 11-21546 | 1/1999 |
| JP | 2001-077098 A | 3/2001 |
| JP | 2001-284308 | 10/2001 |
| JP | 2003-49285 A | 2/2003 |
| JP | 2003-127397 A | 5/2003 |
| JP | 2004-156070 | 6/2004 |
| JP | 2004-176115 | 6/2004 |
| SU | 1308647 A | 5/1987 |
| WO | WO 90/13443 | 11/1990 |
| WO | WO 02/04514 A1 | 6/2002 |

OTHER PUBLICATIONS

M. Yamaguchi, et al., "III. Study of Wet Etching for Electronic Circuits", Proceedings of the 1995 Symposium for Nurturing Young Researchers, pp. 17-22, 1995 (English Abstract), Abstract only.

* cited by examiner

*Primary Examiner* — Nadine Norton
*Assistant Examiner* — Mahmoud Dahimene
(74) *Attorney, Agent, or Firm* — Wolf Greenfield & Sacks, P.C.

(57) ABSTRACT

The present invention aims to provide an etching solution composition which enables to etch a metal film in a controllable manner, form a desired definite tapered shape, and obtain a smooth surface without causing etching solution exudation trace. Said problems have been solved by the present invention, which is an etching solution composition for etching metal films containing one or more surfactants selected from the group consisting of alkyl sulfate or perfluoroalkenyl phenyl ether sulfonic acid and the salts thereof.

11 Claims, No Drawings

ETCHING SOLUTION COMPOSITION FOR METAL FILMS

RELATED APPLICATIONS

This application is a divisional of U.S. application Ser. No. 11/001,737, filed Dec. 2, 2004, now pending, which is incorporated by reference herein.

BACKGROUND OF THE INVENTION

1. Field of the Invention

The present invention relates to an etching solution composition for metal films for use in the manufacturing processes of liquid crystal display devices and semiconductor devices.

2. Description of Related Art

As the etching solution used in the manufacturing processes of liquid crystal display devices and semiconductor devices, a liquid mixture of fluorinated acid, nitric acid, acetic acid, and water; a liquid mixture of fluorinated acid, nitric acid, and water; a liquid mixture of fluorinated acid, ammonium fluoride, and water; a liquid mixture of hydrochloric acid and nitric acid; a liquid mixture of diammonium cerium nitrate (IV), nitric acid, and water; a liquid mixture of diammonium cerium nitrate (IV), perchloric acid, and water; a liquid mixture of phosphoric acid, nitric acid, acetic acid, and water; or a liquid mixture of phosphoric acid, nitric acid, and water is generally known.

Out of these, phosphoric acid based etching solutions are frequently used since they are stable and inexpensive, have little effect on an insulation film in the lower layer, and excel in the controllability of etching.

In the field where multi-layer wiring is required such as the field of liquid crystal display devices and semiconductor devices, a significant challenge in the future would be the control to configure the section of the wiring to be a tapered shape to keep up with the trend of the utilization of thinner films in more layers.

From the growing need of lower resistance for wiring materials in accordance with the advancement of the densification and miniaturization of patterns, aluminum or an aluminum alloy, for example, is being used as the wiring material; typical multi-layer wiring is fabricated by forming an insulation layer on aluminum or aluminum alloy wiring by any suitable means, followed by further forming aluminum or aluminum alloy wiring in the upper layer thereon. The aluminum or aluminum alloy wiring in the lower layer needs to have a cross section of a tapered shape to improve the covering property of the insulation layer lying thereon. In this case, the control of the tapered shape of the wiring in the lower layer (the control of side etching) is important, and failing to obtain a tapered shape with a desired angle may lead to breaks of the wiring in the upper layer.

It is possible, in a wet etching process, to form wiring with a tapered shape by etching an aluminum or aluminum alloy film using a liquid mixture of phosphoric acid-nitric acid-acetic acid-water. It has been reported that, in using the liquid mixture of phosphoric acid-nitric acid-acetic acid-water of volume ratio of 16:2 to 8:2:1, when the baking temperature of the resist is adequate and the resist adheres adequately to the metal film, etching will occur with a large taper angle close to a right angle; however, when the baking temperature of the resist is slightly lower than an adequate temperature, the etching solution tends to penetrate into the interface between the resist and the metal film, thereby causing the etching surface of the metal film to be formed in an one-step tapered shape inclining toward the center of the metal film, and when the concentration of nitric acid is raised, the taper angle will be decreased (see, for example, patent document 1 listed below). On the other hand, it is known that when the concentration of nitric acid is low, an one-step tapered shape with a large taper angle will be formed, but when the concentration of nitric acid is further raised, the etching rate at the interface between the resist and metal film will be increased thereby resulting in the formation of a two-step tapered shape consisting of a step with a small taper angle formed on the side of the interface between the resist and metal film and a step with a large taper angle formed on the side of the substrate, and when the concentration of nitric acid is further raised, an one-step tapered shape with a small inclination will be formed (see, for example, patent document 2, patent document 3 and literature 1 listed below). However, a higher concentration of nitric acid will increase the etching rate of the aluminum or aluminum alloy film and therefore degrade the controllability of the etching, making it difficult to obtain a desired definite tapered shape.

Further, based on the fact that a larger area of aluminum exposed from the resist film will result in a higher etching rate, a technique has been disclosed in which, in order to obtain a desired definite taper angle, for example, in the range of 30 to 50 degrees, the shape of the wiring is formed by a dry etching, thereafter a resist pattern is further formed to remove the resist in the end portion of the wiring, which is to be formed into a tapered shape, and the area adjacent thereto where there is no wiring, and thereafter aluminum film is etched using an etching solution consisting of phosphoric acid, nitric acid, acetic acid, and water (an optimal nitric acid composition is 11.36% to 12.78% by mass)(see, for example, patent document 4 listed below). However, this method, which requires both of a dry etching process used for forming the wiring and a wet etching process used for forming the tapered shape of the end face of wiring, is cumbersome.

On the other hand, it has been reported that when the nitric acid concentration is high in the etching solution consisting of phosphoric acid, nitric acid, acetic acid, and water, the resist will degrade causing cracks on its surface; however, the cracks will be confined within the resist surface (see, for example, patent document 2 listed below). It also has been reported that the resist will be protected by adding acetic acid (see, for example, literature 1 listed below). However, it has been confirmed from an electron micrograph observation of the resist surface for the case in which nitric acid concentration is high that not only cracks are produced on the resist surface, but also etching traces due to the exudation of the etching solution (hereinbelow referred to as "etching solution exudation trace") will occur further inside the etching surface at the interface between the resist and a metal film. As the result of the etching solution exudation trace, the metal film surface will lose its smoothness by being etched, which will cause a problem since a desired shape can not be obtained. Currently, there is no prior art disclosed on the method of preventing the "etching solution exudation trace", and no technique has been developed for etching free from causing etching solution exudation trace when the nitric acid concentration is high.

Furthermore, as the miniaturization of semiconductor processes proceeds, there is a growing need of a high quality metal film surface having a high level of smoothness and no surface roughness after etching. As an attempt to improve the state of the metal film surface after etching by adding an additive, an etching solution has been proposed which is principally composed of phosphoric acid, nitric acid, acetic acid, and water and further added with a trialkylamine oxide surfactant for the purpose of preventing the adsorption of hydrogen which is produced when the metal film is etched by nitric acid onto the metal film surface, since the adsorption of bubbles onto the metal film surface will inhibit etching thereby impairing the smoothness of the etching surface (see, for example, patent document 5 listed below). Moreover, it is known that it is effective to add a surfactant for the purpose of enhancing the wettability to improve the microprocessing capability of the etching solution (see, for example, patent document 6 listed below); however, there has been no mention on forming a tapered shape having a high quality etching surface having a high level of smoothness and no surface roughness.

As described so far, there has not been developed an etching solution composition which can form a tapered shape with a high quality etching surface having a high level of smoothness, a small taper angle, and no surface roughness, and will not cause etching solution exudation trace.

CITED DOCUMENTS

Patent document 1, JP, A, 7-176525;
Patent document 2, JP, A, 6-122982;
Patent document 3, JP, A, 2001-77098;
Patent document 4, JP, A, 2003-127397;
Patent document 5, JP, A, 4-506528;
Patent document 6, JP, A, 2003-49285;
Literature 1, M. Yamaguchi, et al., "III. Study of Wet Etching for Electronic Circuits", Proceedings of the 1995 Symposium for Nurturing Young Researchers, p. 17-22, 1995.

SUMMARY OF THE INVENTION

It is an object of the present invention to provide an etching solution composition with which a metal film particularly of aluminum or an aluminum alloy is etched in a controllable manner to form a desired definite tapered shape and provide a smooth surface without the etching solution exudation trace, thereby solving the above described problem.

The present inventors have found through diligent investigations that the above described problem can be solved by an etching solution composition which contains at least one of alkyl sulfate or perfluoroalkenyl phenyl ether sulfonic acid, which are specific surfactants, and the salts thereof and have eventually completed the invention after conducting further studies.

Accordingly, the present invention relates to an etching solution composition for etching a metal film, comprising one or more surfactants selected from the group consisting of alkyl sulfate or perfluoroalkenyl phenyl ether sulfonic acid, and the salts thereof.

The present invention further relates to the above described etching solution composition, wherein the salt of alkyl sulfate is the salt of alkyl sulfate and triethanolamine or monoethanolamine.

The present invention further relates to the above described etching solution composition, wherein the concentration of the surfactant is 0.001% to 10% by mass.

The present invention further relates to the above described etching solution composition, comprising phosphoric acid, nitric acid, acetic acid, and water.

The present invention further relates to the above described etching solution composition, wherein the metal film is of aluminum or an aluminum alloy.

The etching solution composition for etching metal films according to the present invention can suppress the etching rate of the metal film, particularly of aluminum or aluminum alloy by being added with a specific surfactant consisting of alkyl sulfate or perfluoroalkenyl phenyl ether sulfonic acid and the salts thereof thereby making it possible to make the shape of the metal film after etching to be a desired definite tapered shape.

Moreover, although the etching solution composition according to the present invention has a high concentration of nitric acid, it will not cause etching solution exudation trace.

Furthermore, surprisingly, it is made possible to make the etching surface of the metal film formed after etching to be a smooth surface free from surface roughness. The mechanism of this outcome is inferred, although is not clear, that the surfactants used in the present invention adsorb to the metal film and the resist surfaces serving to protect the metal and the resist surfaces thereby enabling the control of the etching rate so that the shape of the metal film becomes a desired definite tapered shape with a small taper angle after etching, and the etching surface becomes smooth without causing etching solution exudation trace.

Furthermore, even though the etching solution composition of the present invention has a high concentration of nitric acid, the number of cracks observed on the resist surface after etching is fewer compared with the case of conventional etching solutions and, thus, the resist degradation is suppressed.

Furthermore, the etching solution composition of the present invention containing such surfactants does not fall under the TSCA (Toxic Substances Control Act) and therefore offers a high level of safety.

DETAILED DESCRIPTION OF THE PREFERRED EMBODIMENTS

Hereinafter, the embodiments of the present invention will be described.

The etching solution composition of the present invention contains one or more surfactants selected from the group consisting of alkyl sulfate or perfluoroalkenyl phenyl ether sulfonic acid and the salts thereof.

Although these salts may be alkaline metal salts such as sodium salt, salts with organic amino compounds are preferable in the viewpoint of the contamination of the semiconductor substrate.

In particular, the salts of alkyl sulfate are preferably the triethanolamine or monoethanolamine salt of alkyl sulfate.

The etching solution composition of the present invention, which is to be used for the etching of metal films, is particularly suitable for aluminum or aluminum alloys.

The alkyl group of alkyl sulfate and salts thereof used for the etching solution composition of the present invention may be a straight-chain or branched-chain alkyl group in which the number of carbon atoms is preferably 8 to 18, and more preferably 12 to 14.

The alkenyl group of perfluoroalkenyl phenyl ether sulfonic acid and the salt thereof may be a straight-chain or branched-chain alkenyl group in which the number of carbon atoms is preferably 3 to 12, and more preferably 6.

In order to achieve a sufficient suppress effect of the etching rate, not to cause etching solution exudation trace, to form a desired definite tapered shape, and to preserve a good solubility to the etching solution, the concentration of the surfactant is preferably 0.001% to 10% by mass, and more preferably 0.01% to 2% by mass with respect to the entire etching solution composition.

The principal components of the etching solution composition of the present invention are, when used for aluminum or aluminum alloy films, preferably phosphoric acid, nitric acid, acetic acid, and water.

The concentration of each component may be determined within a range in which the etching rate of the aluminum or aluminum alloy film is at a sufficient level. The concentration of phosphoric acid is preferably 30.0% to 60.0% by mass, and more preferably 45.0% to 60.0% by mass; the concentration of nitric acid is preferably 10.0% to 40.0% by mass, and more preferably 15.0% to 30.0% by mass; and the concentration of acetic acid is preferably 1.0% to 20.0% by mass, and more preferably 2.0% to 15.0% by mass.

Using phosphoric acid, nitric acid, acetic acid and water at a concentration within the above described ranges makes it possible to achieve a practical etching rate of not lower than 150 nm/min and therefore is preferable.

EXAMPLES

Hereinafter, examples of the present invention will be shown along with comparison examples to describe the present invention in detail, but the present invention will not be limited to these examples.

Table 1 shows the examples of the present invention along with the comparison examples.

In Table 1, the components and the composition of etching solutions used, and measurement results on the following items obtained using the foregoing etching solutions by means of the following method are shown.

(Etching Rate of Aluminum Film)

A substrate, in which a resist pattern was formed on an aluminum film of a thickness of 500 nm, was immersed for processing in the etching solution for 1 minute at 42.5° C., and was washed with water and dried. Thereafter, the resist was stripped off and the measurement of the amount of etching was conducted by means of a stylus profilometer.

(Taper Angle of an Aluminum Film)

A substrate, in which a liner film and an aluminum film was formed on an Si substrate, was immersed for processing in the etching solution for a time period 1.2 times longer than the exact etching time calculated from the etching rate, and was washed with water and dried. Thereafter, the resist was stripped off and the taper angle of the tapered shape formed was measured by conducting electron microscopy observation.

(Surface Roughness and Etching Solution Exudation Trace of the Etching Surface of Aluminum Film)

A substrate, in which a liner film and an aluminum film was formed on an Si substrate, was immersed for processing in the etching solution for a time period 1.2 times longer than the exact etching time calculated from the etching rate, and was washed with water and dried. Thereafter, the resist was stripped off and the surface roughness and etching solution exudation trace of the etching surface of the aluminum film were evaluated by conducting electron microscopy observation.

TABLE 1

|  | phosphoric acid (% by mass) | Nitric acid (% by mass) | Acetic acid (% by mass) | Surfactant (% by mass) | Etching rate (nm/min.) | Taper angle (degree) | Surface roughness | Etching solution exudation trace |
|---|---|---|---|---|---|---|---|---|
| Example 1 | 57.8 | 17.5 | 2.6 | A 0.08 | 161 | 15 | ○ | ○ |
| Example 2 | 59.8 | 17.5 | 2.6 | A 0.08 | 163 | 14 | ○ | ○ |
| Example 3 | 55.8 | 17.5 | 2.6 | A 0.08 | 160 | 17 | ○ | ○ |
| Example 4 | 57.8 | 17.5 | 2.6 | A 0.03 | 167 | 16 | ○ | ○ |
| Example 5 | 57.8 | 17.5 | 2.6 | A 0.92 | 148 | 16 | ○ | ○ |
| Example 6 | 57.8 | 17.5 | 2.6 | B 0.06 | 367 | 19 | ○ | ○ |
| Comparison example 1 | 57.8 | 17.5 | 2.6 | — | 453 | 33 | X | X |
| Comparison example 2 | 54.1 | 21.7 | 2.1 | — | 412 | 22 | X | X |
| Comparison example 3 | 57.1 | 21.7 | 2.1 | — | 450 | 17 | XX | X |
| Comparison example 4 | 51.1 | 21.7 | 2.1 | — | 380 | 35 | X | X |
| Comparison example 5 | 54.1 | 23.7 | 2.1 | — | 446 | 16 | XX | XX |
| Comparison example 6 | 54.1 | 19.7 | 2.1 | — | 344 | 42 | X | X |
| Comparison example 7 | 54.1 | 21.7 | 5.1 | — | 420 | 24 | X | X |

Notes:

A: Triethanolamine alkyl sulfate; the number of carbon atoms of alkyl 12 to 14

B: Perfluoroalkenyl phenyl ether sulfonic acid; the number of carbon atoms of alkenyl 6

○: no defect,

X: some defects,

XX: significant defects

Each etching solution was used as a solution of 100% by mass by adding water to the phosphoric acid, nitric acid, acetic acid, and the surfactant shown in the Table.

Examples 1 to 6

It is shown that adding triethanolamine alkyl sulfate or perfluoroalkenyl phenyl ether sulfonic acid to the liquid mixture of phosphoric acid, nitric acid, acetic acid, and water makes it possible to suppress the etching rate compared with the cases in which it is not added, to form a desired definite tapered shape with a small angle, and to prevent the occurrences of surface roughness and etching solution exudation trace. Moreover, these etching solution compositions do not fall under the TSCA thereby offering excellent safety.

Comparison Examples 1 to 7

Although it was possible to form a tapered shape with a small angle by increasing the compositions of nitric acid and acetic acid, the etching rate was raised, its control was difficult, surface roughness resulted, and also etching solution exudation trace occurred.

The above described results have shown that the etching solution composition of the present invention will make it possible to form the sectional shape of the metal film after etching into a desired definite tapered shape with a small angle in a well controlled manner, to prevent the surface roughness generated on the etching surface, and to prevent etching solution exudation trace.

Using the etching solution composition for a metal film according to the present invention makes it possible to etch a metal film into a desired definite tapered shape in a controllable manner, to make the etching surface to be a smooth surface without surface roughness, and to prevent the occurrence of etching solution exudation trace. Thus, it is possible to cope with the trend of densification and miniaturization of patterns in a field such as multi-layer wiring in which low resistance metal materials are required.

What is claimed is:

1. A method for etching a metal film into a tapered shape comprising contacting a resist pattern formed on the metal film with an etching solution composition comprising one or more surfactants selected from the group consisting of alkyl sulfate or perfluoroalkenyl phenyl ether sulfonic acid, and the salts thereof, and further comprising phosphoric acid, nitric acid and acetic acid, wherein the concentration of nitric acid is 15.0% to 30.0% by mass.

2. The method according to claim 1, wherein the metal film is of aluminum or an aluminum alloy.

3. The method according to claim 1, wherein the etching rate of the metal film is 367 nm/min, or less.

4. The method according to claim 1, wherein the shape of the metal film is formed with a taper angle of 19° or less.

5. The method according to claim 2, wherein the etching rate of the metal film is 367 nm/min. or less.

6. The method according to claim 2, wherein the shape of the metal film is formed with a taper angle of 19° or less.

7. The method according to claim 1, wherein the concentration of phosphoric acid is 30.0% to 60.0% by mass.

8. The method according to claim 1, wherein the concentration of acetic acid is 1.0% to 20.0% by mass.

9. The method according to claim 6, wherein the concentration of acetic acid is 1.0% to 20.0% by mass.

10. The method according to claim 1, wherein the concentration of acetic acid is 2.0% to 15.0% by mass.

11. The method according to claim 6, wherein the concentration of acetic acid is 2.0% to 15.0% by mass.

* * * * *